United States Patent
Fukushima et al.

(10) Patent No.: US 11,387,151 B2
(45) Date of Patent: Jul. 12, 2022

(54) METHOD OF MEASURING CONCENTRATION OF FE IN P-TYPE SILICON WAFER AND SPV MEASUREMENT APPARATUS

(71) Applicant: SUMCO CORPORATION, Tokyo (JP)

(72) Inventors: Shinya Fukushima, Tokyo (JP); Takehiro Tsunemori, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 185 days.

(21) Appl. No.: 16/771,001

(22) PCT Filed: Oct. 2, 2018

(86) PCT No.: PCT/JP2018/036946
§ 371 (c)(1),
(2) Date: Jun. 9, 2020

(87) PCT Pub. No.: WO2019/123767
PCT Pub. Date: Jun. 27, 2019

(65) Prior Publication Data
US 2020/0373208 A1    Nov. 26, 2020

(30) Foreign Application Priority Data

Dec. 22, 2017 (JP) .............................. JP2017-246955
Dec. 22, 2017 (JP) .............................. JP2017-246979

(51) Int. Cl.
*H01L 21/66* (2006.01)
(52) U.S. Cl.
CPC .............. *H01L 22/14* (2013.01); *H01L 22/12* (2013.01)

(58) Field of Classification Search
CPC ......... H01L 22/12; H01L 22/14; H01L 22/30; H01L 22/00; G01N 2033/0095; G01N 21/9501; G01N 2021/8461
See application file for complete search history.

(56) References Cited

U.S. PATENT DOCUMENTS

| 5,752,985 A | 5/1998 | Nagafune et al. |
| 8,093,920 B2 * | 1/2012 | Lagowski ............... H01L 22/10 324/754.21 |

(Continued)

FOREIGN PATENT DOCUMENTS

| JP | H10-96333 A | 4/1998 |
| JP | 2003-332190 | * 11/2003 |

(Continued)

OTHER PUBLICATIONS

ISR for PCT/JP2018/036946 dated Nov. 6, 2018 (w/ translation).

(Continued)

*Primary Examiner* — Michael M Trinh
(74) *Attorney, Agent, or Firm* — Greenblum & Bernstein, P.L.C.

(57) ABSTRACT

Provided is a method of measuring the concentration of Fe in a p-type silicon wafer by an SPV method enabling improvement in the measurement accuracy for Fe concentrations of $1 \times 10^9/cm^3$ or less. The method of measuring the concentration of Fe in a p-type silicon wafer includes measuring an Fe concentration in the p-type silicon wafer based on measurement using an SPV method. The measurement is performed in an atmosphere in which the total concentration of $Na^+$, $NH_4^+$, and $K^+$ is 1.750 µg/m³ or less, and the total concentration of $F^-$, $Cl^-$, $NO_2^-$, $PO_4^{3-}$, $Br^-$, $NO_3^-$, and $SO_4^{2-}$ is 0.552 µg/m³ or less.

5 Claims, 6 Drawing Sheets

(56) References Cited

U.S. PATENT DOCUMENTS

| | | | | |
|---|---|---|---|---|
| 9,939,511 B2* | 4/2018 | Rapoport | ............... | H01L 29/167 |
| 2004/0010394 A1* | 1/2004 | Koveshnikov | ..... | G01R 31/2831 |
| | | | | 702/183 |
| 2006/0066324 A1* | 3/2006 | Ohno | ....................... | H01L 22/14 |
| | | | | 257/E21.531 |
| 2012/0049329 A1* | 3/2012 | Ohno | ....................... | H01L 22/14 |
| | | | | 257/617 |
| 2018/0284182 A1* | 10/2018 | Fukushima | ............. | H01L 22/14 |

FOREIGN PATENT DOCUMENTS

| | | | |
|---|---|---|---|
| JP | 2003-332190 A | | 11/2003 |
| JP | 2012-49345 A | | 3/2012 |
| WO | WO 2017-061072 | * | 4/2017 |
| WO | WO 2017/061072 A1 | | 4/2017 |

OTHER PUBLICATIONS

IPRP for PCT/JP2018/036946 dated Jun. 23, 2020 (w/translation).
Office Action for KR App. No. 10-2020-7006549, dated Oct. 31, 2021 (w/ translation).
Office Action for JP App. No. 2017-246955, dated Oct. 27, 2020 (w/ translation).
Office Action for JP App. No. 2017-246979, dated Oct. 27, 2020 (w/ translation).

* cited by examiner

METHOD OF MEASURING CONCENTRATION OF FE IN P-TYPE SILICON WAFER AND SPV MEASUREMENT APPARATUS

TECHNICAL FIELD

This disclosure relates to a method of measuring the concentration of Fe in a p-type silicon wafer by a surface photovoltage (SPV) method and to an SPV measurement apparatus.

BACKGROUND

Contamination of a p-type silicon wafer with Fe adversely affects the characteristics of a device fabricated using the wafer. With this being the case, techniques to evaluate the concentration of Fe in p-type silicon wafers in a simplified manner have been developed. One of the techniques is a known method of determining the concentration of Fe in a p-type silicon wafer using the results of electrically measuring the diffusion length of minority carriers by the SPV method.

In the SPV method, a p-type silicon wafer is illuminated with lights of certain wavelengths, and the surface photovoltage (SPV signal) of the wafer of that time is measured to determine the diffusion length of minority carriers in the wafer. This procedure is hereinafter also referred to as simply "SPV measurement". The SPV method is an excellent method that enables a shorter measurement time as compared with other methods and allows for non-contact and non-destructive measurements.

SPV measurements are known to involve two types of measurement modes: Standard Mode and Ultimate Mode. In the SPV method, a plurality of lights of different wavelengths are necessarily used to perform the SPV measurements. Standard Mode is a typical method of performing an SPV measurement using a certain wavelength and then successively performing SPV measurements using wavelengths that are different from the proceeding wavelength and from each other. Ultimate Mode is a special method of performing SPV measurements at a time by concurrently casting light of a plurality of different wavelengths.

PTL 1 describes a technique of measurements with a lowered detection limit for the Fe concentration in a short time by performing an SPV measurement in Ultimate mode and by controlling three measurement parameters of Time Between Readings, Time Constant, and Number of Readings to given numerical ranges.

CITATION LIST

Patent Literature

PTL 1: WO 2017/061072 A

SUMMARY

Technical Problem

The environment in which an SPV measurement apparatus for performing such SPV measurements is placed is recommended to meet: temperature: 24±2° C., relative humidity: 30% to 50%, and cleanliness: class 7 (JIS standards), as described in the specifications of typical SPV measurement apparatuses provided by the manufacturers. Conventionally, SPV measurements have been typically performed in the above recommended environments. The inventors of this disclosure however recognized the following problems.

That is, as long as an SPV measurement is performed in the above recommended environment, sufficient measurement accuracy has been achieved in quantifications at Fe concentrations of the order of $1 \times 10^9/cm^3$ or the order of $1 \times 10^{10}/cm^3$. However, it was found that in quantifications at Fe concentrations of $1 \times 10^9/cm^3$ or less, even if SPV measurements were performed in the above recommended environment, the measured values of the same wafer subjected to SPV measurements a plurality of times varied; in other words, sufficient measurement accuracy was not achieved. For the conventional recommended environment, only the temperature, humidity, and the air particles (cleanliness) were considered, and conditions other than those are not specified. Further, in PTL 1, the environment in which an SPV measurement apparatus is placed is not considered in any way.

In view of the above problems, it could be helpful to provide a method of measuring the concentration of Fe in a p-type silicon wafer by an SPV method enabling improvement in the measurement accuracy for Fe concentrations of $1 \times 10^9/cm^3$ or less and an SPV measurement apparatus.

Solution to Problem

With a view to solving the above problems, the inventors of this disclosure diligently studied to find ways to improve the measurement accuracy for Fe concentrations in a low concentration region of, for example, $1 \times 10^9/cm^3$ or less by optimizing the environment in which an SPV measurement apparatus for performing an SPV measurement is placed in terms other than temperature, humidity, and air particles (cleanliness). As a result, the inventors first found that the ion concentration in the environment in which the SPV measurement apparatus was placed affected the measurement accuracy for the Fe concentration, and the measurement accuracy for Fe concentrations of $1 \times 10^9/cm^3$ or less could be improved by controlling the ion concentration to a certain value or lower. Further, the inventors secondly found that the organic concentration in the environment in which the SPV measurement apparatus was placed affected the measurement accuracy for the Fe concentration, and the measurement accuracy for Fe concentrations of $1 \times 10^9/cm^3$ or less could be improved by controlling the organic concentration to a certain value or lower.

A first group of inventions of this disclosure completed based on the above findings primarily includes the following features.

(1) A method of measuring a concentration of Fe in a p-type silicon wafer based on measurement by an SPV method,
   wherein the measurement is performed in an atmosphere in which a total concentration of $Na^+$, $NH_4^+$, and $K^+$ is 1.750 μg/m$^3$ or less, and a total concentration of $F^-$, $Cl^-$, $NO_2^-$, $PO_4^{3-}$, $Br^-$, $NO_3^-$, and $SO_4^{2-}$ is 0.552 μg/m$^3$ or less.

(2) An SPV measurement apparatus for measuring a concentration of Fe in a p-type silicon wafer based on measurement by an SPV method, the apparatus comprising:
   a measurement stage on which the p-type silicon wafer is placed in the SPV measurement;
   an optical module by which the p-type silicon wafer is illuminated with light;

a probe used to measure a capacitance formed between a capacitive sensor provided on a front end of the probe and a surface of the p-type silicon wafer;

a lock-in amplifier that amplifies and detects an SPV signal corresponding to the capacitance measured with the probe;

a calibration chip for reducing measurement error;

a dissociation stage on which the p-type silicon wafer is placed when subjected to a process of dissociating Fe—B pairs in the p-type silicon wafer;

a flash lamp for dissociating the Fe—B pairs in the p-type silicon wafer;

a robot arm transferring and delivering the p-type silicon wafer to and from the measurement stage and the dissociation stage;

a robot controller for controlling the robot arm;

a first housing receiving the measurement stage, the probe, and the calibration chip;

a second housing receiving the optical module and the lock-in amplifier;

a third housing receiving the dissociation stage and the flash lamp; and a fourth housing receiving the robot arm and the robot controller, wherein a first chemical filter and a second chemical filter are provided in upstream air flows of the first housing and the third housing, respectively, and a total concentration of $Na^+$, $NH_4^+$, and $K^+$ and a total concentration of $F^-$, $Cl^-$, $NO_2^-$, $PO_4^{3-}$, $Br$, $NO_3^-$, and $SO_4^{2-}$ in an atmosphere inside each of the first housing and the third housing are set to 1.750 μg/m$^3$ or less and 0.552 μg/m$^3$ or less, respectively.

(3) The SPV measurement apparatus according to (2) above, wherein a third chemical filter is provided in an upstream air flow of the fourth housing, and a total concentration of $Na^+$, $NH_4^+$, and $K^+$ and a total concentration of $F^-$, $Cl^-$, $NO_2^-$, $PO_4^{3-}$, $Br$, $NO_3^-$, and $SO_4^{2-}$ in an atmosphere inside the fourth housing are set to 1.750 μg/m$^3$ or less and 0.552 μg/m$^3$ or less, respectively.

(4) The SPV measurement apparatus according to (2) above, wherein the first chemical filter and the second chemical filter are provided above the first housing and the third housing, respectively.

(5) The SPV measurement apparatus according to (3) above, wherein the third chemical filter is provided above the fourth housing.

A second group of inventions of this disclosure completed based on the above findings primarily includes the following features.

(6) A method of measuring a concentration of Fe in a p-type silicon wafer based on measurement by an SPV method, wherein the measurement is performed in an atmosphere in which an organic concentration measured by a wafer exposure test is 0.05 ng/cm$^2$ or less.

(7) An SPV measurement apparatus for measuring a concentration of Fe in a p-type silicon wafer based on measurement by an SPV method, the apparatus comprising:

a measurement stage on which the p-type silicon wafer is placed in the SPV measurement;

an optical module by which the p-type silicon wafer is illuminated with light;

a probe used to measure a capacitance formed between a capacitive sensor provided on a front end of the probe and a surface of the p-type silicon wafer;

a lock-in amplifier that amplifies and detects an SPV signal corresponding to the capacitance measured with the probe;

a calibration chip for reducing measurement error;

a dissociation stage on which the p-type silicon wafer is placed when subjected to a process of dissociating Fe—B pairs in the p-type silicon wafer;

a flash lamp for dissociating the Fe—B pairs in the p-type silicon wafer;

a robot arm transferring and delivering the p-type silicon wafer to and from the measurement stage and the dissociation stage;

a robot controller for controlling the robot arm;

a first housing receiving the measurement stage, the probe, and the calibration chip;

a second housing receiving the optical module and the lock-in amplifier;

a third housing receiving the dissociation stage and the flash lamp; and a fourth housing receiving the robot arm and the robot controller, wherein a first chemical filter and a second chemical filter are provided in upstream air flows of the first housing and the third housing, respectively, and an inorganic concentration in an atmosphere inside each of the first housing and the third housing, measured by a wafer exposure test, is set to 0.05 ng/cm$^2$ or less.

(8) The SPV measurement apparatus according to (7) above, wherein a third chemical filter is provided in an upstream air flow of the fourth housing, and an inorganic concentration in an atmosphere inside the fourth housing, measured by a wafer exposure test, is set to 0.05 ng/cm$^2$ or less.

(9) The SPV measurement apparatus according to (7) above, wherein the first chemical filter and the second chemical filter are provided above the first housing and the third housing, respectively.

(10) The SPV measurement apparatus according to (8) above, wherein the third chemical filter is provided above the fourth housing.

Advantageous Effect

The method of measuring the concentration of Fe in a p-type silicon wafer by an SPV method and the SPV measurement apparatus, according to this disclosure can improve the measurement accuracy for Fe concentrations of $1 \times 10^9$/cm$^3$ or less.

DETAILED DESCRIPTION

Figure 1:
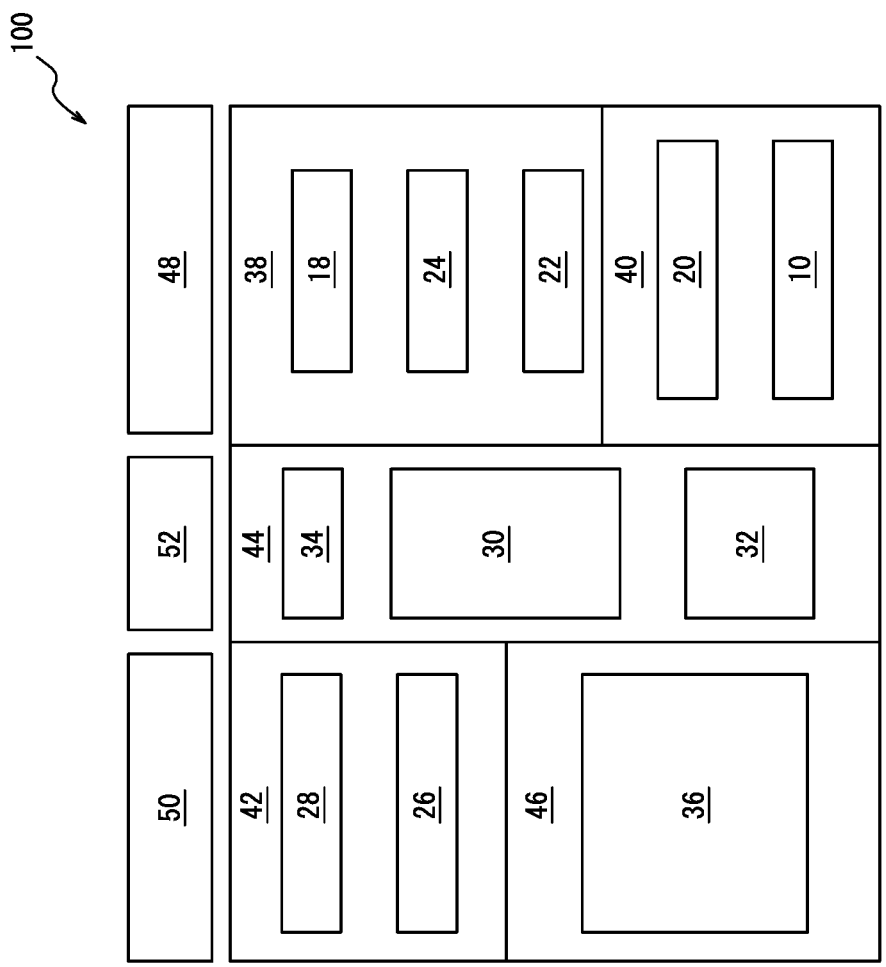
FIG. 1 is a schematic view illustrating the structure of an SPV measurement apparatus 100 according to one embodiment of this disclosure.

One embodiment of this disclosure relates to a method of measuring the concentration of Fe in a p-type silicon wafer based on the measurement of the Fe concentration in a silicon wafer by an SPV method (SPV measurement).

First, how to determine the Fe concentration at a certain portion in the surface of the p-type silicon wafer will be described. Fe present in the p-type silicon wafer in a normal state combines with a dopant (for example, boron) by electrostatic force to form Fe—B pairs. On the other hand, when the wafer is illuminated with intense light, Fe becomes dissociated from B. The diffusion length of minority carriers, determined by SPV measurement means a distance over which the minority carriers generated by the light casted in the SPV measurement can move. The minority carriers are annihilated for example by being trapped by a trap level formed by Fe in the wafer. Trap levels formed by Fe in the p-type silicon wafer include Fe—B (iron-boron pairs) which is inherently present and Fei (interstitial iron) formed by the light illumination. The trap levels formed by Fe in different forms have different minority carrier trapping abilities. Specifically, Fe can more easily trap minority carriers and the diffusion length is shorter in the dissociated state than in the normal state. Using the difference, the Fe concentration in the wafer can be found as follows.

First, SPV measurement is performed in a normal state and the diffusion length $L_{FeB}$ of minority carriers is determined. Next, SPV measurement is performed in a dissociated state and the diffusion length $L_{Fei}$ of minority carriers is determined. The Fe concentration [Fe] can be calculated by the following formula (1).

$$[Fe]=C\times(1/L_{Fei}^2-1/L_{FeB}^2) \quad (1),$$

where C is a constant.

Thus, a map of the Fe concentration in the wafer can be obtained by performing SPV measurements in the normal state and in the dissociated state on a plurality of portions in the wafer surface. The process for dissociating Fe—B pairs is by a usual method, for example, but not limited to illumination using a flash lamp.

Next, referring to FIG. 2, an SPV measurement apparatus 100 according to one embodiment of this disclosure will be described, focusing on the structure relating to SPV measurements. The SPV measurement apparatus 100 has an optical module 10, a probe 18, a lock-in amplifier 20, and a measurement stage 22. The optical module 10 has a light source 12, a chopper 14, and a filter wheel 16.

The light source 12 is composed of for example white LEDs, and an optical path is designed so that light emitted from the light source is directed to the surface of a p-type silicon wafer W placed on the measurement stage 22. The chopper 14 is a circular member having a plurality of openings in a circular pattern. The rotation of the chopper allows light emitted from the light source 12 to have a frequency. In other words, the surface of the p-type silicon wafer W is illuminated with the light intermittently. The frequency of light obtained here is defined as a "chopping frequency (CF)", which is one of the measurement parameters. The CF is typically set to around 500 Hz to 3000 Hz.

The filter wheel 16 has the openings 16A to 16D provided with filters that transmit only lights having different wavelengths. This allows the surface of the p-type silicon wafer W to be illuminated with lights having certain wavelengths.

Figure 2:
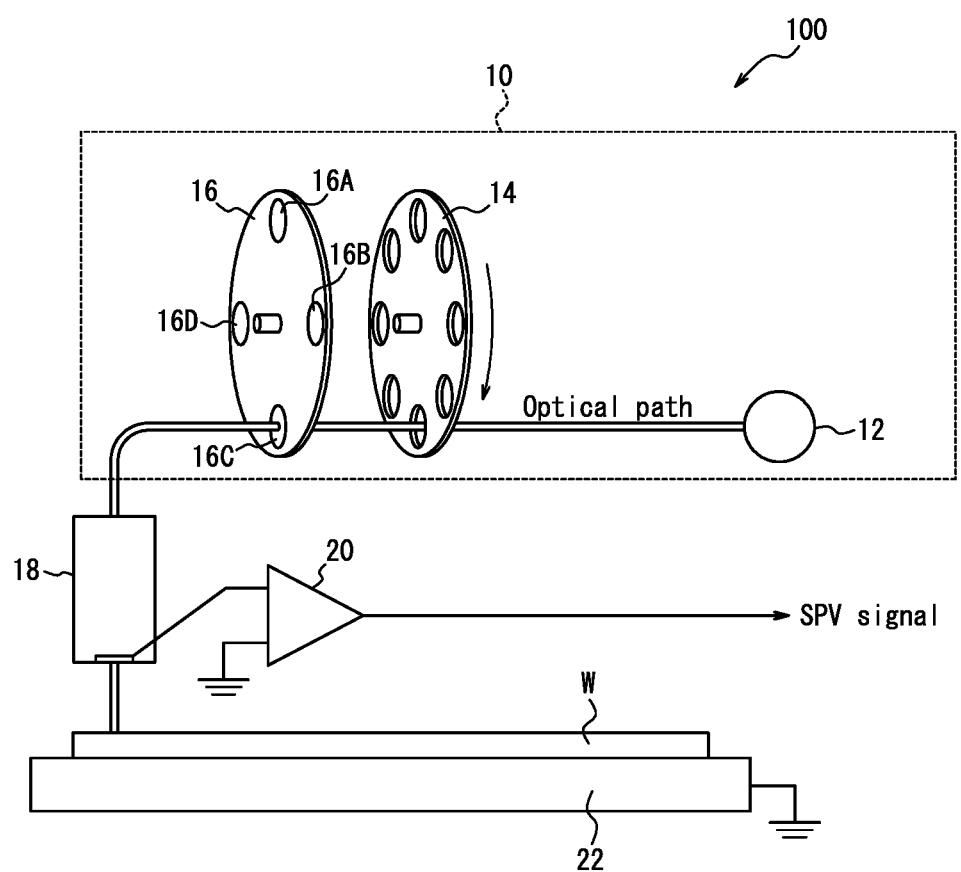
FIG. 2 is a schematic view of part of the SPV measurement apparatus 100, illustrating the structure relating to the SPV measurement for measuring the concentration of Fe in a p-type silicon wafer.

Here, FIG. 2 illustrates a case where the optical module 10 is an analog module; alternatively, it may be a digital module. In the case where the optical module 10 is a digital module, a plurality of single color LEDs having different emission wavelengths are modularized, and the surface of the p-type silicon wafer W can be illuminated with lights having certain wavelengths with certain frequencies by making the LEDs flash.

The wavelengths of the illumination lights may be any different wavelengths between 780 nm to 1004 nm. However, when SPV measurements are performed using lights having two wavelengths, a combination of 780 nm and 1004 nm can be given as an example of the wavelengths, and when SPV measurements are performed using lights having four wavelengths, a set of 780 nm, 914 nm, 975 nm, and 1004 nm can be given as an example.

The intensity (amount) of illumination light is set as Injection Level, which is one of the measurement parameters. Typically, the amount of light of Level 2 is $2\times10^{12}$ (atoms/cc), and that of Level 3 is $3\times10^{12}$ (atoms/cc), and one of these two parameters is used.

The probe 18 has a capacitive sensor on its front end, thereby continuously measuring the capacitance formed between the surface of the p-type silicon wafer W and the probe 18. Prior to SPV measurement, the surface of the p-type silicon wafer W is subjected to a HF treatment to be positively charged. When the wafer W is illuminated with light from the light source 12, minority carriers (electrons for a p-type wafer) are generated in the wafer and migrate toward the positively charged surface. Upon reaching the surface, the electrons are annihilated by the positive charges on the surface, so that the electric potential of the surface decreases, resulting in reduced capacitance. The drop in the capacitance is detected as an SPV signal. When more electrons are trapped by Fe in the p-type silicon wafer, the surface potential is less likely to be reduced.

The lock-in amplifier 20 amplifies and detects an SPV signal corresponding to the capacitance measured with the probe 18. Thus, an SPV signal can be obtained. Moving the measurement stage 22 allows SPV measurements to be performed on a plurality of portions on the surface of the p-type silicon wafer W.

The SPV apparatus may be a known SPV apparatus, such as for example FAaST 330 manufactured by Semilab-SDi LLC or SPV Station 1020 manufactured by Strategic Diagnostics Inc.

Next, a method of an SPV measurement and how to determine the diffusion length will be described. First, SPV measurement is performed using light having a first wavelength (for example, 780 nm) to obtain an SPV signal corresponding to the light. In a graph, the "penetration length" dependent on the wavelength of the illumination light is represented by the X-axis, and the "amount of light/SPV signal" is represented by the Y-axis. The measurement results are plotted in the graph. Subsequently, an SPV measurement is performed using light having a second wavelength (for example, 1004 nm) different from the first wavelength to obtain an SPV signal corresponding to the light. Similarly, the measurement results are plotted in the graph. The X intercept of the straight line joining the thus obtained two plots can be determined as a "diffusion length".

Note that when SPV measurements are performed using three or more wavelengths, since three or more plots are obtained, the X intercept is calculated by approximation such as the method of least squares.

Here, the measurement modes include two existing modes of Standard Mode and Ultimate Mode. In Standard Mode, an SPV measurement is performed using a certain wavelength and sequentially other SPV measurements are performed using wavelengths that are different from the preceding wavelength and from each other, so that the plots are obtained sequentially. On the other hand, in Ultimate Mode, illumination with a plurality of lights having different wavelengths is performed by SPV measurements at a time, so that the plots are obtained by the one-time measurement. In this case, chopping frequencies of the wavelengths are made different from each other, thereby obtaining SPV signals having different frequencies in the lock-in amplifier 20; thus, SPV signals corresponding to the respective wavelengths can be obtained separately. In this embodiment, the measurement mode is not limited.

(First Group of Inventions)

Here, in this embodiment, it is important to perform an SPV measurement in an atmosphere in which a total concentration of $Na^+$, $NH_4^+$, and $K^+$ is 1.750 μg/m$^3$ or less, and a total concentration of $F^-$, $Cl^-$, $NO_2^-$, $PO_4^{3-}$, $Br^-$, $NO_3^-$, and $SO_4^{2-}$ is 0.552 μg/m$^3$ or less. Accordingly, in this embodiment, the measurement accuracy for Fe concentrations of $1\times10^9$/cm$^3$ or less can be improved by reducing the ion concentration in the SPV measurement atmosphere.

The mechanism of such an effect is assumed as follows. First, for anions, as described above, in an SPV measurement on a p-type silicon wafer, the surface of the wafer is required to be positively passivated by pretreatment such as HF cleaning. Here, when an acidic gas (anions) is in contact with the passivated (weakly charged) surface, the measured value of the diffusion length varies. Further, when a measurement at an Fe concentration of $1\times10^9$/cm$^3$ or less is performed, the difference between the diffusion lengths before and after dissociation is small ($L_{FeB} \approx L_{Fei}$), thus the measurement variation in the diffusion length has great influence. Accordingly, it is assumed that the measurement of the diffusion length is stabilized by removing anions, and the quantitativity of the Fe—B energy level density can be improved.

Next, for cations, a calibration chip is integrated in or mounted on an SPV measurement apparatus to calibrate the apparatus, and this chip is built in an n-type silicon wafer. The surface of the n-type silicon wafer is negatively passivated as opposed to the p-type silicon wafer. When an alkaline gas (cations) is in the measurement atmosphere, the measurement accuracy of the calibration chip is poor and this affects the calibration in the diffusion length measurement. Accordingly, it is assumed that the absolute value of the measurement of the diffusion length is ensured by removing cations, and the quantitativity of the Fe—B energy level density can be improved.

In the silicon wafer production process, sodium hydroxide or potassium hydroxide is chiefly used as an alkaline etchant, and nitric hydrofluoric acid is chiefly used as an acidic etchant. Bromic acid salt may be added to the alkaline etchant, and phosphoric acid or sulfuric acid may be added to the acidic etchant. Further, aqueous ammonium, hydrochloric acid, and hydrogen peroxide are chiefly used as cleaning solutions for wafers. It is only necessary to consider, as gases generated in the use of those chemicals, three types of cations: $Na^+$, $NH_4^+$, and $K^+$ and seven types of anions: $F^-$, $Cl^-$, $NO_2^-$, $PO_4^{3-}$, $Br^-$, $NO_3^-$, and $SO_4^{2-}$.

Further, although the external air contains ions such as $Na^+$ and $Cl^-$ from salt wind; however, this does not matter as long as the ions mentioned above are monitored.

By way of example, an aspect of controlling the ion concentration in the SPV measurement atmosphere is controlling the ion concentration as described above in an environment in which the SPV measurement apparatus is placed. Specifically, in a clean room in which the SPV measurement apparatus is placed, chemical filters such as a cation filter for removing cations and an anion filter for removing anions are placed so as to control the ion concentration as described above in the atmosphere in the clean room. Examples of the cation filter include PureLite PF590F4H manufactured by Nippon Puretec Co., Ltd. and PL-C-25-4 GI manufactured by Dan-Takuma Technologies Inc. Examples of the anion filter include PureLite P592E5H manufactured by Nippon Puretec Co., Ltd. and PL-A-30-4 GO manufactured by Dan-Takuma Technologies Inc. The place in which the chemical filters are placed in the clean room may be determined as appropriate in terms of suitably reducing the ion concentration in the atmosphere in the clean room. The air inside a clean room usually consists of circulated air and the external air taken in to compensate for pressure loss. The circulated air is purified through a HEPA filter placed midway through (preferably on the ceiling of the clean room) the air flow formed by a circulation fan, and introduced into the clean room. The clean room is also designed to guide the air introduced through an external air inlet to the circulation fan. Accordingly, the chemical filters are preferably placed on the external air inlet and also between the circulation fan and the HEPA filter.

Another aspect of controlling the ion concentration in the SPV measurement atmosphere is controlling the ion concentration as described above in the atmosphere of a certain space in the SPV measurement apparatus 100 used for the measurement. This aspect will be described below with reference to FIG. 1.

The SPV measurement apparatus 100 is segmented into a plurality of spaces using a plurality of housings. A first housing 38 receives the measurement stage 22 and the probe 18 that have already been described with reference to FIG. 2, and a calibration chip 24 for reducing measurement error. A second housing 40 receives the optical module 10 and the lock-in amplifier 20 that have already been described with reference to FIG. 2. A third housing 42 receives a dissociation stage 26 on which a p-type silicon wafer is placed when Fe—B pairs in the p-type silicon wafer are dissociated, and a flash lamp 28 for dissociating the Fe—B pairs in the p-type silicon wafer. A fourth housing 44 receives a robot arm 30 for transferring and delivering the p-type silicon wafer to and from the measurement stage 22 and the dissociation stage 26, a robot controller 32 for controlling the robot arm 30, and an aligner 34 for aligning the position of a notch of the p-type silicon wafer. A fifth housing 46 receives a control computer 36 for controlling the entire apparatus.

The p-type silicon wafer W is transferred as described below and subjected to an SPV measurement. First, a plurality of p-type silicon wafers W received in a load port not shown are put on the robot arm 30 provided in the fourth housing 44 one by one, and the notch of each wafer is aligned by the aligner 34. Next, the wafer is transferred into the first housing 38 by the robot arm 30 and placed on the measurement stage 22. Next, the wafer is subjected to an SPV measurement in a normal state on the measurement stage 22. Next, the wafer is delivered from the first housing 38 by the robot arm 30, transferred into the third housing 42, and placed on the dissociation stage 26. Next, the wafer is subjected to dissociation treatment by being illuminated on the dissociation stage 26 by the flash lamp 28, resulting in a dissociation state. Next, the wafer is delivered from the third housing 42 by the robot arm 30, transferred back into the first housing 38, and placed on the measurement stage 22. Next, the wafer is subjected to an SPV measurement in the dissociation state on the measurement stage 22. Finally, the wafer is delivered from the first housing 38 by the robot arm 30, unloaded from the SPV measurement apparatus 100, and returned to the load port.

Here, it is important that a first chemical filter 48 and a second chemical filter 50 are provided in upstream air flows of the first housing 38 and the third housing 42, respectively, and the total concentration of $Na^+$, $NH_4^+$, and $K^+$ and the total concentration of $F^-$, $Cl^-$, $NO_2^-$, $PO_4^{3-}$, $Br^-$, $NO_3^-$, and $SO_4^{2-}$ in an atmosphere inside each of the first housing 38 and the third housing 42 are set to 1.750 µg/m³ or less and 0.552 µg/m³ or less, respectively. In the SPV measurement, at least the atmosphere in the first housing 38 where the measurement is actually performed and the atmosphere of the third housing 42 where the dissociation treatment is performed are required to be controlled. Controlling the atmosphere in the first and third housings as described above would not affect the measured values, since ions are not deposited on the measurement stage 22 or the dissociation stage 26 and are not attached to the back surface of the wafer. For the first chemical filter 48 and the second chemical filter 50, the cation filters and the anion filters mentioned above can suitably be used.

Further, in terms of further improving measurement accuracy, preferably, a third chemical filter 52 is provided in an upstream air flow of the fourth housing 44 to also control the atmosphere in the fourth housing 44 as described above. This further improves the measurement accuracy, since ions are not deposited on the robot arm 30 in the fourth housing 44 and are not attached to the back surface of the wafer.

It should be noted that the first housing 38, the third housing 42, and the fourth housing 44 may be integrated to segment one measurement space (into a measurement area, a dissociation treatment area, and a transfer area).

Further, to prevent turbulence from being caused in the air flow as possible, the first, second, and third chemical filters 48, 50, 52 are preferably provided above the first, third, and fourth housings 38, 42, 44, respectively.

(Second Group of Inventions)

Here, in this embodiment, it is important to perform an SPV measurement in an atmosphere in which the organic concentration measured by a wafer exposure test is 0.05 ng/cm² or less. Accordingly, in this embodiment, the measurement accuracy for the Fe concentrations of $1\times10^9$/cm³ or less can be improved by reducing the organic concentration in the SPV measurement atmosphere.

The mechanism of such an effect is assumed as follows. As described above, in an SPV measurement on a p-type silicon wafer, the surface of the wafer is required to be positively passivated by pretreatment such as HF cleaning. Here, when an organic material adheres the passivated (weakly charged) surface, weak charge results in varied measured values of the diffusion length. Further, when a measurement at an Fe concentration of $1\times10^9$/cm³ or less is performed, the difference between the diffusion lengths before and after dissociation is small ($L_{FeB} \approx L_{Fei}$), thus the measurement variation in the diffusion length has great influence. Accordingly, it is assumed that the measurement of the diffusion length is stabilized by removing organic materials, and the quantitativity of the Fe—B energy level density can be improved.

In the silicon wafer production process, an alcohol-based solvent such as isopropyl alcohol (IPA) may be used after the wafer cleaning. Further, particularly in a process of producing an epitaxial wafer with an embedded diffusion layer, since photo resist is used, hexamethyldisilazane (HMDS) for improving the adhesion of the resist, an organic liquid such as tetramethylammonium hydroxide (TMAH) as a developer, etc. are used. Further, the external air may contain organic materials in the exhausts from factories including the relevant factory, and such organic materials are brought into the clean room when the external air is taken into the clean room. To address this, in this embodiment, the measurement accuracy for Fe concentrations of $1\times10^9$/cm³ or less is improved by removing those organic materials.

By way of example, an aspect of controlling the organic concentration in the SPV measurement atmosphere is controlling the organic concentration as described above in an environment in which the SPV measurement apparatus is placed. Specifically, in a clean room in which the SPV measurement apparatus is placed, chemical filters for removing organic materials is placed so as to control the organic concentration as described above in the atmosphere in the clean room. Examples of the chemical filters for removing organic materials include PureLite PF592FN (MAF) manufactured by Nippon Puretec Co., Ltd. The place in which the chemical filters are placed in the clean room may be determined as appropriate in terms of suitably reducing the organic concentration in the atmosphere in the clean room. The chemical filters are preferably placed on the external air inlet and also between the circulation fan and the HEPA filter, as in the first group of inventions.

Another aspect of controlling the organic concentration in the SPV measurement atmosphere is controlling the organic concentration as described above in the atmosphere of a certain space in the SPV measurement apparatus 100 used for the measurement. For the description of the basic structure of the SPV measurement apparatus 100 with reference to FIG. 1, hereinafter refer to the description of the first group of inventions.

Here, it is important that a first chemical filter 48 and a second chemical filter 50 are provided in upstream air flows of the first housing 38 and the third housing 42, respectively, and the concentration of organic materials measured by a wafer exposure test is set to 0.05 ng/cm² or less in the first housing 38 and the third housing 42. In the SPV measurement, at least the atmosphere in the first housing 38 where the measurement is actually performed and the atmosphere of the third housing 42 where the dissociation treatment is performed are required to be controlled. Controlling the atmosphere in the first and third housings as described above would not affect the measured values, since organic materials are not deposited on the measurement stage 22 or the dissociation stage 26 and are not attached to the back surface of the wafer. For the first chemical filter 48 and the second chemical filter 50, the chemical filters mentioned above can suitably be used.

Further, in terms of further improving measurement accuracy, preferably, a third chemical filter 52 is provided in an upstream air flow of the fourth housing 44 to also control the atmosphere in the fourth housing 44 as described above. This further improves the measurement accuracy, since organic materials are not deposited on the robot arm 30 in the fourth housing 44 and are not attached to the back surface of the wafer.

It should be noted that the first housing 38, the third housing 42, and the fourth housing 44 may be integrated to segment one measurement space (into a measurement area, a dissociation treatment area, and a transfer area).

Further, to prevent turbulence from being caused in the air flow as possible, the first, second, and third chemical filters 48, 50, 52 are preferably provided above the first, third, and fourth housings 38, 42, 44, respectively.

EXAMPLES

Experimental Example 1

Experimental Example 1 relating to the first group of inventions is described below.

Example

An SPV measurement apparatus (FAaST 330 (digital) manufactured by Semilab-SDi LLC) was placed in a clean room. In the relevant clean room, an anion filter (PureLite P592E5H manufactured by Nippon Puretec Co., Ltd.) and a cation filter (PureLite PF590F4H manufactured by Nippon Puretec Co., Ltd.) were newly provided to reduce the ion concentration. Table 1 shows the ion concentration measured by the following method. Note that Nos. 1 to 6 correspond to measurements performed on different days. Environmental conditions other than the ion concentration were temperature: 24±2° C., relative humidity: 30% to 50%, and cleanliness: class 7 (JIS standards) as recommended by the manufacturer.

<Ion Concentration Measurement Method>

The ion concentration was measured by a pure water impinger bubbling method.

Pure water: 100 mL
Suction speed: 1 L/min
Suction time: 360 min
Analyzer: ion chromatography The conversion into the ion concentration in an atmosphere of 1 $m^3$ was performed using the following conversion formula.

Value found by the analysis (analysis value) [ppb]× amount of pure water recovered [mL]/suction amount [$m^3$]= ion concentration [μg/$m^3$]

Of total nine p-type silicon wafers prepared; three p-type silicon wafers had an Fe concentration of the order of $10^8$/$cm^3$, three p-type silicon wafers had an Fe concentration in the first half of the order of $10^9$/$cm^3$, and three p-type silicon wafers had an Fe concentration in the second half of the order of $10^9$/$cm^3$ to the order of $10^{10}$/$cm^3$. In the atmospheres corresponding to Nos. 1 to 6 in Table 1, the Fe concentration of 177 points in the surface of each wafer was measured three times using the above SPV measurement apparatus. The measurement conditions were set as recommended by the manufacturer, and the illumination wavelength was set to 780 nm and 1004 nm.

<Evaluation of Measurement Accuracy>

For each wafer, variations of the three average Fe concentrations of 177 points in the surface (variance of the three average Fe concentrations/average of the three average Fe concentrations×100) are given as CV values in Table 2. The CV value is preferably 10% or less.

Further, the number of undefined points where $L_{Fei}$>$L_{FeB}$ in the values measured with respect to the 177 points in each wafer was counted, and the average of the three average values is shown as an average UD value in Table 3.

In Table 2 and Table 3, the wafers having an Fe concentration of the order the of $10^8$/$cm^3$ are represented as "WFs 1 to 3", the wafers having an Fe concentration in the first half of the order of $10^9$/$cm^3$ are represented as "WFs 4 to 6", and the wafers having an Fe concentration in the second half of the order of $10^9$/$cm^3$ to the order of $10^{10}$/$cm^3$ are represented as "WFs 7 to 9". The average value of the three average Fe concentrations measured for each wafer in Example is given in Table 4.

Figure 3:
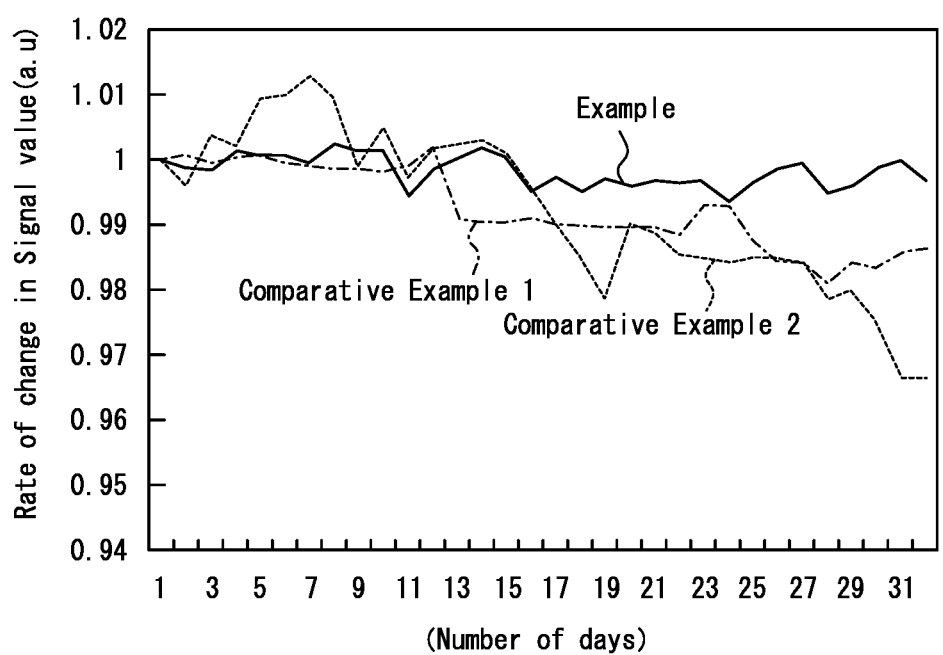
FIG. 3 is a graph illustrating the rate of change in the Signal value obtained using a calibration chip in Experimental Example 1.

Further, aside from the above SPV measurements, measurements of Signal values using a calibration chip was performed every day for one month, and the rate of change was found, given the Signal value of the first day was 1. The results are given in FIG. 3.

Comparative Example 1

Measurements of ion concentrations and evaluation of the measurement accuracy were performed in the same manner as in Example except that no chemical filter was provided in the clean room and so the ion concentration was not reduced. The results are given in Tables 1 to 3 and FIG. 3.

Comparative Example 2

Measurements of ion concentrations and evaluation of the measurement accuracy were performed in the same manner as in Example using an SPV measurement apparatus of the same model as in Example, provided in a clean room of a different factory from Comparative Example 1, in which clean room no chemical filter was provided. The results are given in Tables 1 to 3 and FIG. 3.

TABLE 1

| Category | No. | Cation | | | Anion | | | | | | |
|---|---|---|---|---|---|---|---|---|---|---|---|
| | | $Na^+$ | $NH_4^+$ | $K^+$ | $F^-$ | $Cl^-$ | $NO_2^-$ | $PO_4^{3-}$ | $Br^-$ | $NO_3^-$ | $SO_4^{2-}$ |
| Example | 1 | <0.002 | 1.143 | <0.003 | <0.006 | <0.002 | <0.500 | <0.017 | <0.011 | <0.008 | <0.008 |
| | 2 | <0.002 | 1.744 | <0.003 | <0.006 | <0.002 | <0.500 | <0.017 | <0.011 | <0.008 | <0.008 |
| | 3 | <0.002 | 1.383 | 0.007 | <0.006 | <0.002 | <0.500 | <0.017 | <0.011 | <0.008 | <0.008 |
| | 4 | <0.002 | 1.143 | <0.003 | <0.006 | <0.002 | <0.500 | <0.017 | <0.011 | <0.008 | <0.008 |
| | 5 | <0.002 | 1.289 | 0.005 | <0.006 | <0.002 | <0.500 | <0.017 | <0.011 | <0.008 | <0.008 |
| | 6 | <0.002 | 1.444 | <0.003 | <0.006 | <0.002 | <0.500 | <0.017 | <0.011 | <0.008 | <0.008 |
| Comparative Example 1 | 1 | <0.002 | 2.067 | <0.003 | 0.026 | 0.052 | <0.500 | 0.017 | 0.011 | 0.440 | 0.017 |
| Comparative Example 2 | 1 | 0.018 | 7.596 | 0.025 | 0.010 | 0.012 | 0.748 | 0.017 | 0.011 | 0.020 | 0.013 |
| | 2 | 0.017 | 4.869 | 0.086 | 0.007 | 0.013 | 1.567 | 0.017 | 0.011 | 0.035 | 0.009 |
| | 3 | 0.017 | 5.074 | 0.025 | 0.008 | 0.010 | 1.698 | 0.017 | 0.011 | 0.064 | 0.013 |
| | 4 | 0.017 | 5.401 | 0.025 | 0.006 | 0.016 | 1.688 | 0.017 | 0.011 | 0.092 | 0.021 |
| | 5 | 0.017 | 5.074 | 0.025 | 0.008 | 0.010 | 1.698 | 0.017 | 0.011 | 0.064 | 0.013 |

TABLE 1-continued

| Category | No. | Cation | | | Anion | | | | | | |
|---|---|---|---|---|---|---|---|---|---|---|---|
| | | Na$^+$ | NH$_4^+$ | K$^+$ | F$^-$ | Cl$^-$ | NO$_2^-$ | PO$_4^{3-}$ | Br$^-$ | NO$_3^-$ | SO$_4^{2-}$ |
| | 6 | 0.017 | 5.991 | 0.025 | 0.019 | 0.013 | 2.136 | 0.017 | 0.011 | 0.030 | 0.023 |
| | 7 | 0.017 | 6.005 | 0.025 | 0.006 | 0.018 | 1.537 | 0.017 | 0.011 | 0.057 | 0.025 |
| | 8 | 0.017 | 6.310 | 0.025 | 0.006 | 0.017 | 0.981 | 0.017 | 0.011 | 0.040 | 0.009 |

TABLE 2

| Category | CV value (%) | | | | | | | | |
|---|---|---|---|---|---|---|---|---|---|
| | WF1 | WF2 | WF3 | WF4 | WF5 | WF6 | WF7 | WF8 | WF9 |
| Example | 3.0% | 5.8% | 3.0% | 2.2% | 1.9% | 1.4% | 0.0% | 1.3% | 1.1% |
| | 4.7% | 7.9% | 3.5% | 1.8% | 1.2% | 1.4% | 1.1% | 0.9% | 0.6% |
| | 4.9% | 3.8% | 8.8% | 0.8% | 1.0% | 0.8% | 0.4% | 0.3% | 0.6% |
| | 5.4% | 9.6% | 5.5% | 0.8% | 1.3% | 1.7% | 0.7% | 1.6% | 0.3% |
| | 7.9% | 4.8% | 6.9% | 1.4% | 1.8% | 1.1% | 0.8% | 0.4% | 0.3% |
| | 5.0% | 8.8% | 6.0% | 2.2% | 2.1% | 1.2% | 0.9% | 0.7% | 0.8% |
| Comparative Example 1 | 12.1% | 15.3% | 18.4% | 2.1% | 1.0% | 0.5% | 0.5% | 2.8% | 1.4% |
| Comparative Example 2 | 16.7% | 28.8% | 19.6% | 4.6% | 2.9% | 1.8% | 1.1% | 2.0% | 1.2% |
| | 24.7% | 10.9% | 28.1% | 4.9% | 2.1% | 3.9% | 1.8% | 1.3% | 1.6% |
| | 19.2% | 17.9% | 15.7% | 3.8% | 4.8% | 0.4% | 1.2% | 1.7% | 0.9% |
| | 27.9% | 11.2% | 13.1% | 3.0% | 5.8% | 3.0% | 2.2% | 1.9% | 1.4% |
| | 19.0% | 12.8% | 30.4% | 4.3% | 6.3% | 5.9% | 0.8% | 1.8% | 1.4% |
| | 57.7% | 29.5% | 24.1% | 5.9% | 2.8% | 4.8% | 0.4% | 1.2% | 1.7% |
| | 13.3% | 24.7% | 10.9% | 3.9% | 4.7% | 1.1% | 1.1% | 1.3% | 0.8% |
| | 14.8% | 21.5% | 14.1% | 3.9% | 2.8% | 1.6% | 1.2% | 1.4% | 3.0% |

TABLE 3

| Category | Average UD (number) | | | | | | | | |
|---|---|---|---|---|---|---|---|---|---|
| | WF1 | WF2 | WF3 | WF4 | WF5 | WF6 | WF7 | WF8 | WF9 |
| Example | 0 | 5 | 1 | 0 | 0 | 0 | 0 | 0 | 0 |
| | 3 | 5 | 2 | 0 | 0 | 0 | 0 | 0 | 0 |
| | 0 | 0 | 0 | 0 | 0 | 0 | 0 | 0 | 0 |
| | 1 | 0 | 0 | 0 | 0 | 0 | 0 | 0 | 0 |
| | 0 | 1 | 0 | 0 | 0 | 0 | 0 | 0 | 0 |
| | 2 | 3 | 0 | 0 | 0 | 0 | 0 | 0 | 0 |
| Comparative Example 1 | 16 | 6 | 10 | 0 | 0 | 0 | 0 | 0 | 0 |
| Comparative Example 2 | 23 | 10 | 22 | 1 | 0 | 0 | 0 | 0 | 0 |
| | 14 | 33 | 21 | 0 | 0 | 0 | 0 | 0 | 1 |
| | 12 | 30 | 4 | 1 | 0 | 0 | 0 | 0 | 0 |
| | 29 | 23 | 6 | 2 | 0 | 0 | 0 | 0 | 0 |
| | 38 | 31 | 55 | 1 | 0 | 1 | 0 | 0 | 0 |
| | 41 | 15 | 10 | 8 | 10 | 2 | 0 | 1 | 1 |
| | 16 | 6 | 14 | 6 | 4 | 0 | 1 | 0 | 1 |
| | 10 | 13 | 7 | 0 | 0 | 0 | 0 | 0 | 0 |

TABLE 4

| WF | Average Fe concentration (/cm$^3$) |
|---|---|
| WF1 | 8.5.E+08 |
| WF2 | 7.7.E+08 |
| WF3 | 7.8.E+08 |
| WF4 | 4.1.E+09 |
| WF5 | 4.3.E+09 |
| WF6 | 4.2.E+09 |
| WF7 | 1.4.E+10 |
| WF8 | 6.6.E+09 |
| WF9 | 9.3.E+09 |

<Evaluation Results>

As evident from Table 2 and Table 3, the CV value was made as low as 10% or less and the average UD value was minimized to almost zero in Example even when the Fe concentration was $1 \times 10^9 /cm^3$ or less. On the other hand, in Comparative Examples 1, 2, the CV value exceeded 10% and the average UD value was also high at an Fe concentration of $1 \times 10^9 /cm^3$ or less. Further, as evident from FIG. 3, change in the Signal value was small in Example. On the other hand, change in the Signal value was large in Comparative Examples 1, 2; the amount of reduction in the Signal value was especially large in Comparative Example 2 where the number of cations was large.

Experimental Example 2

Experimental Example 2 relating to the second group of inventions is described below.

Example

An SPV measurement apparatus (FAaST 330 (digital) manufactured by Semilab-SDi LLC) was placed in a clean room. In the relevant clean room, a chemical filter for removing organic materials (PureLite PF-592FN (MAF) manufactured by Nippon Puretec Co., Ltd.) was provided to reduce the organic concentration. Table 5 shows the organic concentration measured by the following method. Environmental conditions other than the organic concentration were temperature: 24±2° C., relative humidity: 30% to 50%, and cleanliness: class 7 (JIS standards) as recommended by the manufacturer.

<Organic Concentration Measurement Method>

The organic concentration was measured by the wafer exposure test as described below. A silicon wafer having a diameter of 300 mm was exposed in a clean room atmosphere for 5 hours. After that, the exposed wafer was heated, and the mass of the whole liberated gas was analyzed by GC-MS. The analysis value (ng) obtained was converted to a value per the wafer area (cm$^2$) as an organic concentration (ng/cm$^2$).

Of total nine p-type silicon wafers prepared; three p-type silicon wafers had an Fe concentration of the order of $10^8/cm^3$, three p-type silicon wafers had an Fe concentration in the first half of the order of $10^9/cm^3$, and three p-type silicon wafers had an Fe concentration in the second half of the order of $10^9/cm^3$ to the order of $10^{10}/cm^3$. In the atmospheres of the organic concentrations given in Table 1, the Fe concentration of 177 points in the surface of each wafer was measured three times using the above SPV measurement apparatus. The measurement conditions were set as recommended by the manufacturer, and the illumination wavelength was set to 780 nm and 1004 nm.

<Evaluation of Measurement Accuracy>

Figure 4:
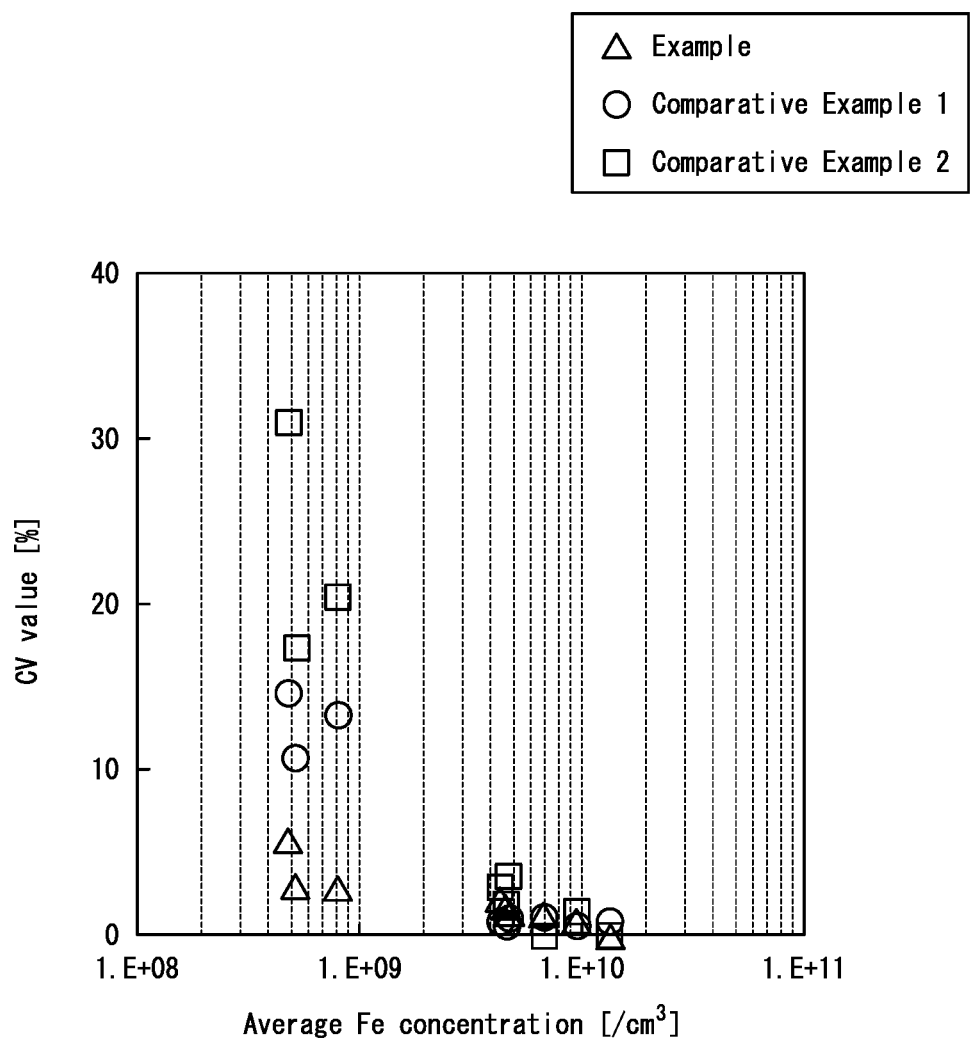
FIG. 4 is a graph illustrating the relationship between the average Fe concentration and the CV value in Example of Experimental Example 2, Comparative Example 1, and Comparative Example 2.

For each wafer, variations of the three average Fe concentrations of 177 points in the surface (variance of the three average Fe concentrations/average of the three average Fe concentrations×100) were found as CV values. FIG. 4 presents a graph in which the average of the three average Fe concentrations in each wafer is plotted on the horizontal axis, and the CV value is plotted on the vertical axis. The CV value is preferably 10% or less.

Figure 5:
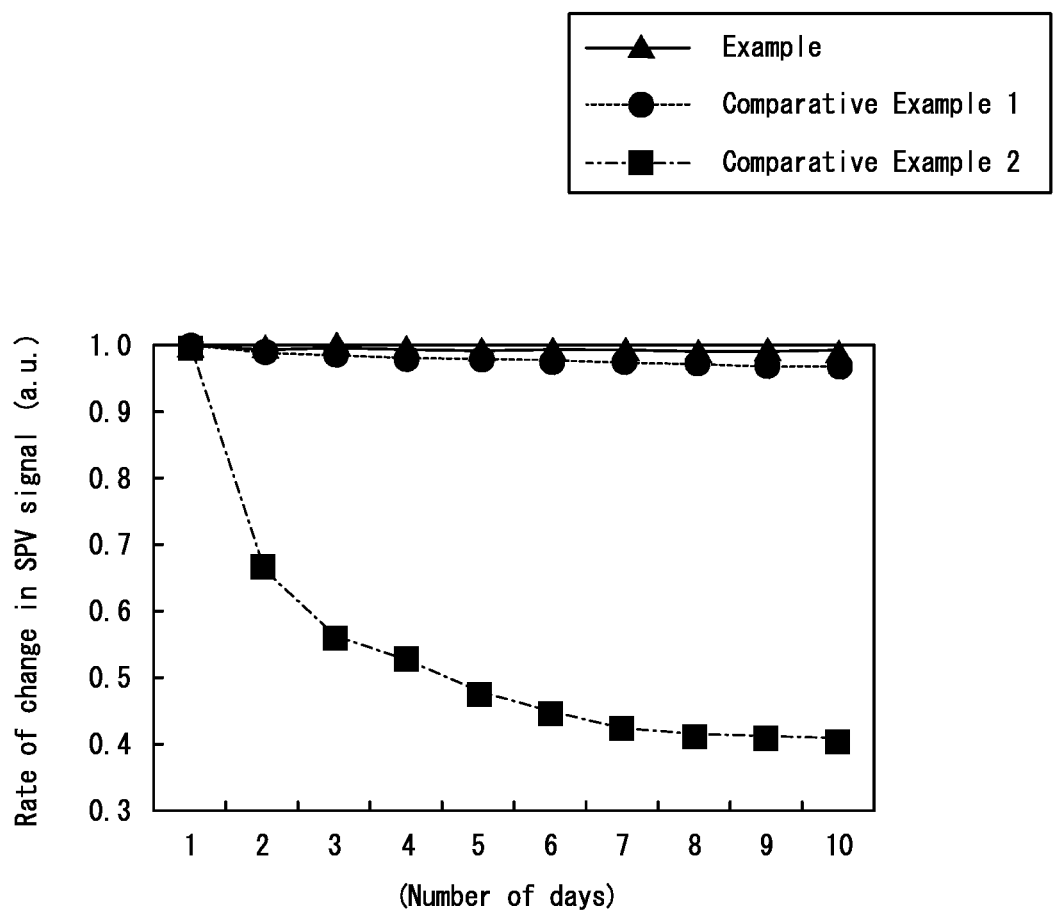
FIG. 5 is a graph illustrating the rate of change in the SPV signal value in Example of Experimental Example 2, Comparative Example 1, and Comparative Example 2 when the center point of each p-type silicon wafer was measured once a day for ten days.
Figure 6:
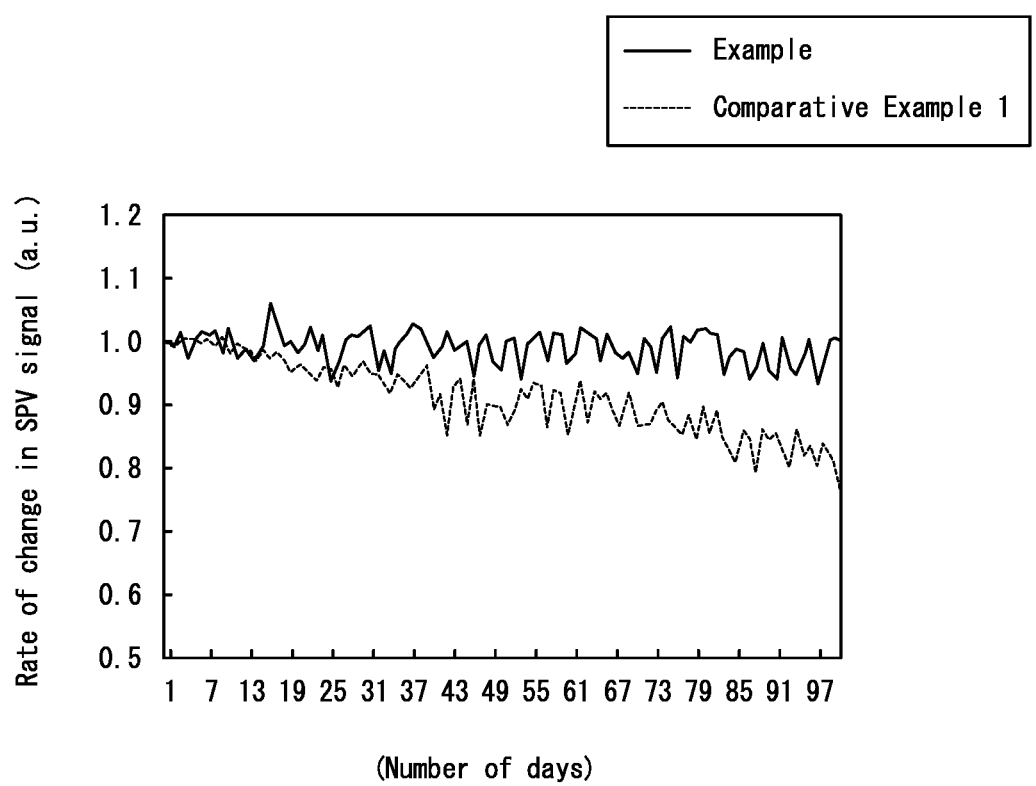
FIG. 6 is a graph illustrating the rate of change in the SPV signal value in Example of Experimental Example 2 and Comparative Example 1 when the center point of each p-type silicon wafer was measured once a day for 100 days.

Further, aside from the above SPV measurements, the rate of change in the Signal value of one center point of each Fe concentration of the order of $10^8/cm^3$ measured repeatedly once a day for ten days is given in FIG. 5, given the measured value of the first time was 1. Further, in order to further ascertain the change in the SPV signal values, the measurement was continued to the one hundredth day in Example and Comparative Example 1, and the rate of change is given in FIG. 6, given the measured value of the first time day was 1, as in FIG. 5.

Comparative Example 1

Evaluation of the measurement accuracy was performed in the same manner as in Example except for the environment in which no chemical filter was provided, little external air was taken into the clean room, and circulation was increased. The results are given in Table 5 and FIGS. 4 to 6.

Comparative Example 2

Evaluation of the measurement accuracy was performed in the same manner as in Example except for the environment in which no chemical filter was provided, a large amount of external air was taken into the clean room, and circulation was reduced. The results are given in Table 5 and FIGS. 4 to 5.

TABLE 5

| Category | Organic concentration (ng/cm$^2$) |
|---|---|
| Example | 0.05 |
| Comparative Exaxmple 1 | 0.08 |
| Comparative Exaxmple 2 | 0.42 |

<Evaluation Results>

As evident from FIG. 4, in Example in which less organic materials were present in the atmosphere, the CV value was made as low as 10% or less even at an Fe concentration of $1 \times 10^9 /cm^3$ or less. On the other hand, in Comparative Examples 1, 2 in which rather more organic materials were present in the atmosphere, the CV value exceeded 10% at an Fe concentration of $1 \times 10^9 /cm^3$ or less. This demonstrates that when the Fe concentration is $1 \times 10^9 /cm^3$ or less, in an environment in which the concentration of organic materials measured by the wafer exposure test is more than 0.05 ng/cm$^2$, the reproducibility of repeated measurements is poor.

Further, FIG. 5 demonstrates that the value of the SPV signal was reduced each time the measurement was performed in Comparative Example 2, FIG. 6 demonstrates that the value of the SPV signal was gradually reduced in a long term also in the environment in the environment of Comparative Example 1, and the reduction reached as high as 25% one hundred days later. On the other hand, no reduction in the value of the SPV signal was observed. The above results indicate that if the environment contains a large amount of organic materials, the measurement intensity is low even when the same measurements are performed, thus the reliability of the measured values is low. Thus, in the environment containing a large amount of organic materials, the organic materials annihilate surface charge or produce electrical noise, which is considered to affect electrical signals of the SPV measurements.

INDUSTRIAL APPLICABILITY

The method of measuring the concentration of Fe in a p-type silicon wafer by an SPV method and the SPV measurement apparatus, according to this disclosure improves the measurement accuracy for Fe concentrations of $1 \times 10^9/cm^3$ or less.

REFERENCE SIGNS LIST

100: SPV measurement apparatus
10: Optical module
12: Light source
14: Chopper
16: Filter wheel
18: Probe
20: Lock-in amplifier
22: Measurement stage
24: Calibration chip
26: Dissociation stage
28: Flash lamp
30: Robot arm
32: Robot controller
34: Aligner
36: Control computer
38: First housing
40: Second housing
42: Third housing
44: Fourth housing
46: Fifth housing
48: First chemical filter
50: Second chemical filter
52: Third chemical filter
W: P-type silicon wafer

The invention claimed is:

1. A method of measuring a concentration of Fe in a p-type silicon wafer based on measurement by an SPV method,
wherein the measurement is performed in an atmosphere in which a total concentration of $Na^+$, $NH_4^+$, and $K^+$ is 1.750 µg/m³ or less, and a total concentration of $F^-$, $Cl^-$, $NO_2^-$, $PO_4^{3-}$, $Br^-$, $NO_3^-$, and $SO_4^{2-}$ is 0.552 µg/m³ or less.

2. An SPV measurement apparatus for measuring a concentration of Fe in a p-type silicon wafer based on measurement by an SPV method, the apparatus comprising:
a measurement stage on which the p-type silicon wafer is placed in the SPV measurement;
an optical module by which the p-type silicon wafer is illuminated with light;
a probe used to measure a capacitance formed between a capacitive sensor provided on a front end of the probe and a surface of the p-type silicon wafer;
a lock-in amplifier that amplifies and detects an SPV signal corresponding to the capacitance measured with the probe;
a calibration chip for reducing measurement error;
a dissociation stage on which the p-type silicon wafer is placed when subjected to a process of dissociating Fe—B pairs in the p-type silicon wafer;
a flash lamp for dissociating the Fe—B pairs in the p-type silicon wafer;
a robot arm transferring and delivering the p-type silicon wafer to and from the measurement stage and the dissociation stage;
a robot controller for controlling the robot arm;
a first housing receiving the measurement stage, the probe, and the calibration chip;
a second housing receiving the optical module and the lock-in amplifier;
a third housing receiving the dissociation stage and the flash lamp; and
a fourth housing receiving the robot arm and the robot controller,
wherein a first chemical filter and a second chemical filter are provided in upstream air flows of the first housing and the third housing, respectively, and a total concentration of $Na^+$, $NH_4^+$, and $K^+$ and a total concentration of $F^-$, $Cl^-$, $NO_2^-$, $PO_4^{3-}$, $Br^-$, $NO_3^-$, and $SO_4^{2-}$ in an atmosphere inside each of the first housing and the third housing are set to 1.750 µg/m³ or less and 0.552 µg/m³ or less, respectively.

3. The SPV measurement apparatus according to claim 2, wherein a third chemical filter is provided in an upstream air flow of the fourth housing, and a total concentration of $Na^+$, $NH_4^+$, and $K^+$ and a total concentration of $F^-$, $Cl^-$, $NO_2^-$, $PO_4^{3-}$, $Br^-$, $NO_3^-$, and $SO_4^{2-}$ in an atmosphere inside the fourth housing are set to 1.750 µg/m³ or less and 0.552 µg/m³ or less, respectively.

4. The SPV measurement apparatus according to claim 2, wherein the first chemical filter and the second chemical filter are provided above the first housing and the third housing, respectively.

5. The SPV measurement apparatus according to claim 3, wherein the third chemical filter is provided above the fourth housing.

* * * * *